United States Patent
Hsish et al.

(10) Patent No.: US 6,730,900 B2
(45) Date of Patent: May 4, 2004

(54) CAMERA WITH MOS OR CMOS SENSOR ARRAY

(75) Inventors: Tzu-Chiang Hsish, Fremont, CA (US); Calvin Chao, Cupertino, CA (US)

(73) Assignee: e-Phocus, Inc., San Jose, CA (US)

( * ) Notice: Subject to any disclaimer, the term of this patent is extended or adjusted under 35 U.S.C. 154(b) by 0 days.

(21) Appl. No.: 10/371,618

(22) Filed: Feb. 22, 2003

(65) Prior Publication Data

US 2003/0146372 A1 Aug. 7, 2003

Related U.S. Application Data

(63) Continuation-in-part of application No. 10/072,637, filed on Feb. 5, 2002, and a continuation-in-part of application No. 10/229,953, filed on Aug. 27, 2002, and a continuation-in-part of application No. 10/229,954, filed on Aug. 27, 2002, and a continuation-in-part of application No. 10/229,955, filed on Aug. 27, 2002, and a continuation-in-part of application No. 10/229,956, filed on Aug. 27, 2002.

(51) Int. Cl.$^7$ ............................................... H01L 27/00

(52) U.S. Cl. .................... 250/208.1; 250/214 R

(58) Field of Search .................. 250/208.1, 214 R, 250/214.1, 370.08, 370.14; 257/291, 292, 440, 431

(56) References Cited

U.S. PATENT DOCUMENTS 5,898,753 A * 4/1999 Schick et al. ............... 378/54

* cited by examiner

Primary Examiner—Que T. Le
(74) Attorney, Agent, or Firm—John R. Ross; John R. Ross, III

(57) ABSTRACT

A novel MOS or CMOS based active sensor array for producing electronic images from electron-hole producing light. Each pixel of the array includes a layered photodiode for converting the electron-hole producing light into electrical charges and MOS and/or CMOS pixel circuits located under the layered photodiodes for collecting the charges. The present invention also provides additional MOS or CMOS circuits in and/or on the same crystalline substrate for converting the collected charges into images and manipulating image data. The layered photodiode of each pixel is fabricated as continuous layers of charge generating material on top of the MOS and/or CMOS pixel circuits so that extremely small pixels are possible with almost 100 percent packing factors. In a preferred embodiment the sensor is a 0.3 mega pixel (3.2 mm×2.4 mm, 640×480) array of 5 micron square pixels which is compatible with a lens of ¼.5 inch optical format. In a preferred embodiment the sensor along with focusing optics is incorporated into a cellular phone camera or a camera attachment the cellular phone to permit transmission of visual images along with the voice communication.

36 Claims, 4 Drawing Sheets

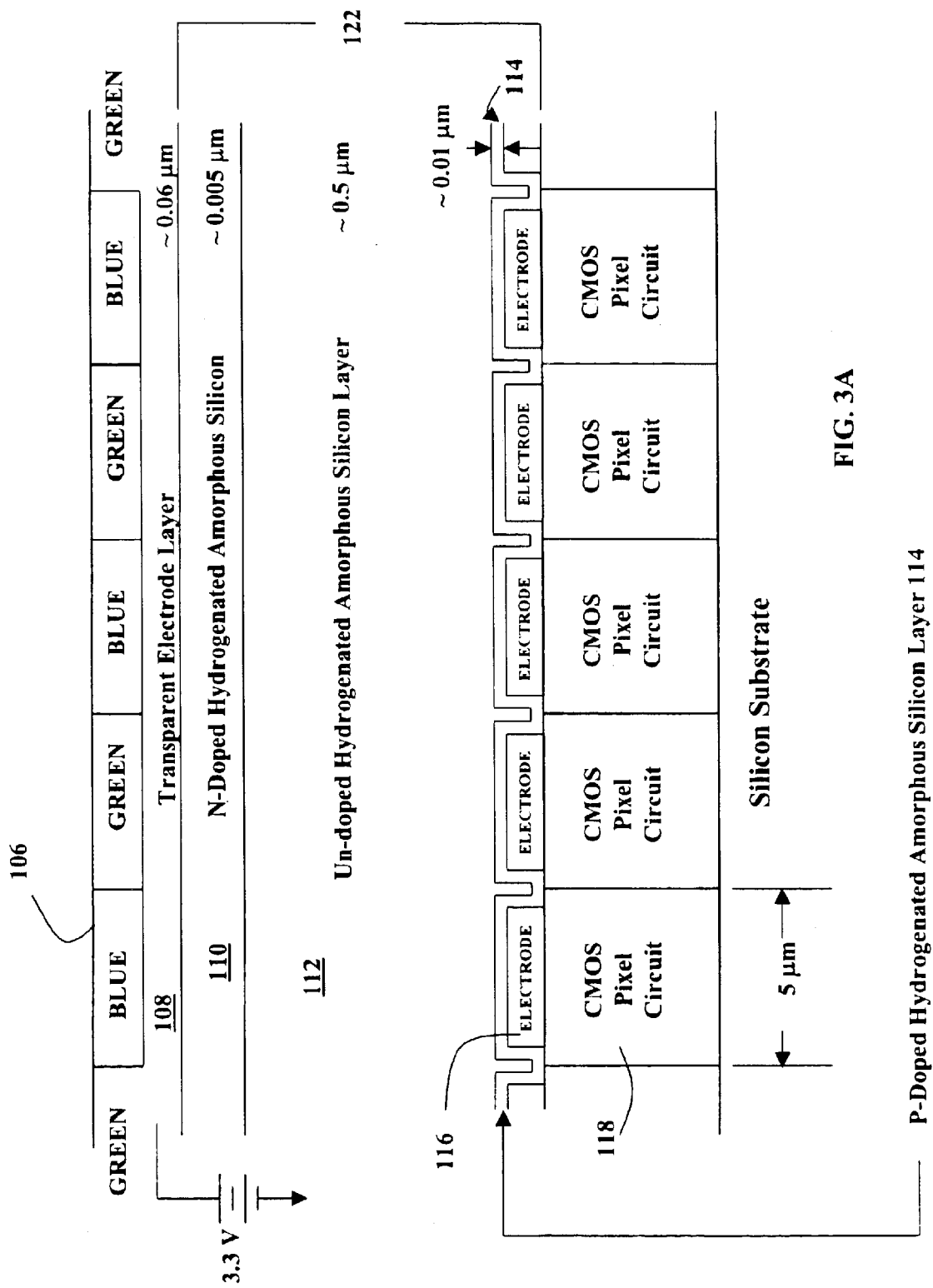

CAMERA WITH MOS OR CMOS SENSOR ARRAY

This application is a continuation in part of U.S. patent applications Ser. Nos. 10/072,637 filed Feb. 5, 2002, 10/229,953 filed Aug. 27, 2002, 10/229,954 filed Aug. 27, 2002, 10/229,955 filed Aug. 27, 2002, 10/229,956 filed Aug. 27, 2002. The present invention relates to cameras and in particular to very small cameras.

FIELD OF THE INVENTION

BACKGROUND OF THE INVENTION

Electronic image sensors are typically comprised of pixel arrays of a large number of very small light detectors, together called "pixel arrays". These sensors typically generate electronic signals that have amplitudes that are proportional to the intensity of the light received by each of the detectors in the array. Electronic cameras comprise imaging components to produce an optical image of a scene onto the pixel array. The electronic image sensors convert the optical image into a set of electronic signals. These electronic cameras typically include components for conditioning and processing the electronic signals to allow images to be converted into a digital format so that the images can be processed by a digital processor and/or transmitted digitally. Various types of semiconductor devices can be used for acquiring the image. These include charge couple devices (CCDs), photodiode arrays and charge injection devices. The most popular electronic image sensors utilize arrays of CCD detectors for converting light into electrical signals. These detectors have been available for many years and the CCD technology is mature and well developed. One big drawback with CCD's is that the technique for producing CCD's is incompatible with other integrated circuit technology such as MOS and CMOS technology, so that processing circuits and the CCD arrays must be produced on chips separate from the CCD's.

Another currently available type of image sensors is based on metal oxide semiconductor (MOS) technology or complementary metal oxide semi-conductor (CMOS) technology. These sensors are commonly referred to as CMOS sensors. CMOS sensors have multiple transistors within each pixel. The most common CMOS sensors has photosensing circuitry and active circuitry designed in each pixel cell. They are called active pixel sensors (APS's). The active circuitry consists of multiple transistors that are interconnected by metal lines; as a result, this area is opaque to visible light and cannot be used for photo-sensing. Thus, each pixel cell typically comprises photosensitive and non-photosensitive circuitry. In addition to circuitry associated with each pixel cell, CMOS sensors have other digital and analog signal processing circuitry, such as sample-and-hold amplifiers, analog-to-digital converters and digital signal processing logic circuitry, all integrated as a monolithic device. Both pixel arrays and other digital and analog circuitry are fabricated using the same basic process sequence.

Small cameras which utilize CCD arrays to convert an optical image to an electronic image have been commercially available for many years. Also, attempts have been made to produce small visible light cameras using CMOS sensors on the same chip with processing circuits. One such attempt is described in recently issued U.S. Pat. No. 6,486,503.

Small cameras using CCD sensors consume large amounts of energy (as compared to cameras with CMOS sensors) and require high rail-to-rail voltage swings to operate CCD. This can pose problems for today's mobile appliances, such as Cellular Phone and Personal Digital Assistant. On the other hand, small cameras using CMOS sensors may provide a solution for energy consumption; but the traditional CMOS-based small cameras suffer low light sensing performance, which is intrinsic to the nature of CMOS APS sensors caused by shallow junction depth in the silicon substrate and its active transistor circuitry taking away the real estate preciously needed for photo-sensing.

U.S. Pat. Nos. 5,528,043 5,886,353, 5998,794 and 6,163,030 are examples of prior art patents utilizing CMOS circuits for imaging which have been licensed to Applicants' employer. U.S. Pat. No. 5,528,043 describes an X-ray detector utilizing a CMOS sensor array with readout circuits on a single chip. In that example image processing is handled by a separate processor (see FIG. 4 which is FIG. 1 in the '353 patent. U.S. Pat. No. 5,886,353 describes a generic pixel architecture using a hydrogenated amorphous silicon layer structure, either p-i-n or p-n or other derivatives, in conjunction with CMOS circuits to for the pixel arrays. U.S. Pat. Nos. 5,998,794 and 6,163,030 describe various ways of making electrical contact to the underlying CMOS circuits in a pixel. All of the above US patents are incorporated herein by reference.

Combining CMOS and MOS sensors with external processors can result in complexity and increase production costs. A need exists for improved camera technology which can provide cameras with cost, quality and size improvements over prior art cameras.

SUMMARY OF THE INVENTION

The present invention provides a novel MOS or CMOS based active sensor array for producing electronic images from electron-hole producing light. Each pixel of the array includes a layered photodiode for converting the electron-hole producing light into electrical charges and MOS and/or CMOS pixel circuits located under the layered photodiodes for collecting the charges. The present invention also provides additional MOS or CMOS circuits in and/or on the same crystalline substrate for converting the collected charges into images. The layered photodiode of each pixel is fabricated as continuous layers of charge generating material on top of the MOS and/or CMOS pixel circuits so that extremely small pixels are possible with almost 100 percent packing factors. In a preferred embodiment the sensor is a 0.3 mega pixel (3.2 mm×2.4 mm, 640×480) array of 5 micron square pixels which is compatible with a lens of ¼.5 inch optical format. In a preferred embodiment the sensor along with focusing optics is incorporated into a cellular phone camera or a camera attachment the cellular phone to permit transmission of visual images along with the voice communication. In preferred embodiments all of the camera circuits are incorporated on or in a single crystalline substrate along with the sensor pixel circuits. The result is an extremely low cost camera at high volume production which can be made extremely small (e.g., smaller than the human eye). High volume production costs for the above 0.3 mega-pixel camera are projected to be less than $10 per camera.

BRIEF DESCRIPTION OF THE DRAWINGS

FIG. 3A is a partial cross-sectional diagram illustrating pixel cell architecture for five pixels of a sensor array utilizing principals of the present invention.

DETAILED DESCRIPTION OF A PREFERRED EMBODIMENT

In the following description of preferred embodiments, reference is made to the accompanying drawings, which form a part hereof, and which show by way of illustration a specific embodiment of the invention. It is to be understood by those of working skill in this technological field that other embodiments may be utilized, and structural, electrical, as well as procedural changes may be made without departing from the scope of the present invention.

Figure 1A:
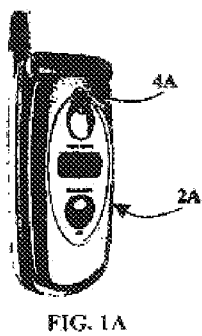
FIGS. 1A and 1B are drawings of cellular phones with equipped with a camera utilizing a camera with a CMOS sensor array according to the present invention.
Figure 1B:
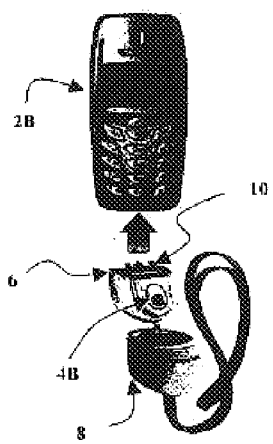
Figure 1C:
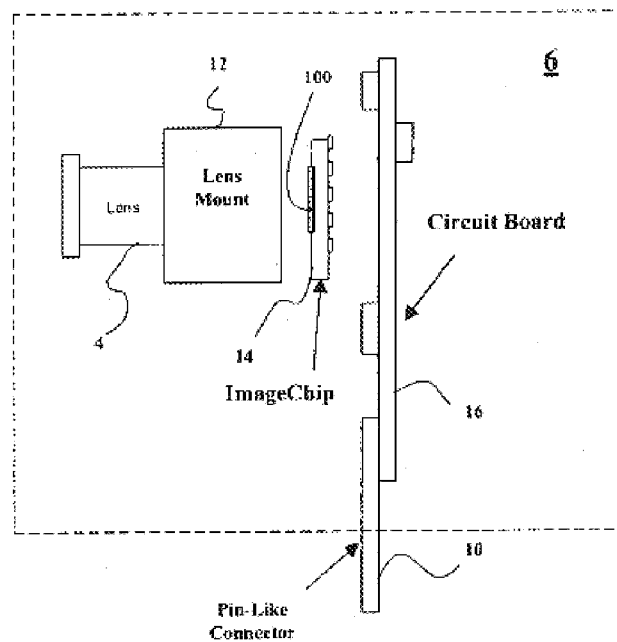
FIG. 1C shows some details of the camera.

Single Chip Camera with Photo Conductor on Active Pixel Sensor A preferred embodiment of the present invention is a single chip camera with a sensor consisting of a photodiode array consisting of photoconductive layers on top of an active array of CMOS circuits. (Applicants refer to this sensor as a "POAP Sensor" the "POAP" referring to "Photoconductor On Active Pixel".) In this sensor there are 307,200 pixels arranged in as a 640×480 pixel array and there is a transparent electrode on top of the photoconductive layers. The pixels are 5 microns×5 microns and the packing fraction is approximately 100 percent. The active dimensions of the sensor are 3.2 mm×2.4 mm and a preferred lens unit is a standard lens with a ¼.5 inch optical format. A preferred application of the camera is as a component of a cellular phone as shown in FIGS. 1A and 1B. In the 1A drawing the camera is an integral part of the phone 2A and the lens is shown at 4A. In the 1B drawing the camera 6 is separated from the phone 2B and connected to it through the 3 pin-like connectors 10. The lens of the camera is shown at 4B and a camera protective cover is shown at 8. FIG. 1C is a block diagram showing the major features of the camera 4B shown in the 1B drawing. They are lens 4, lens mount 12, image chip 14, sensor pixel array 100, circuit board 16, and pin-like connector 10.

CMOS Sensor

The sensor section is implemented with a photoconductor on active pixel array, readout circuitry, readout timing/control circuitry, sensor timing/control circuitry and analog-to-digital conversion circuitry. The sensor includes:

1) a CMOS-based pixel array comprised 640×480 charge collectors and 640×480 CMOS pixel circuits and
2) a CMOS readout circuit.

The sensor array is similar to the visible light sensor array described in U.S. Pat. No. 5,886,353 (see especially text at columns 19 through 21 and FIG. 27) which is incorporated by reference herein. Details of various sensor arrays are also described in the parent patent applications referred to in the first sentence of this specification all of which have also been incorporated herein by reference. FIGS. 2, 3A, 3B and 3C describe features of a preferred sensor array for this cell phone camera. The general layout of the sensor is shown at 100 in FIG. 2. The sensor includes the pixel array 102 and readout and timing/control circuitry 104. FIG. 3A is a drawing showing the layered structure of a 5 pixel section of the pixel array.

The sensor array is coated with color filters and each pixel is coated with only one color filter to define only one component of the color spectrum. The preferred color filters set is comprises three broadband color filters with peak transmission at 450 nm (B), 550 nm (G) and 630 nm (R). The full width of half maximum of the color filters is about 50 nm for Blue and Green filters. The Red filter typically has transmission all the way into near infrared. For visible image application, an IR cut-off filter needs to be used to tailor the Red response to be peaked at 630 nm with about 50 nm full width of half maximum. These filters are used for visible light sensing applications. Four pixels are formed as a quadruplet, as shown in FIG. 3C. Two of the four pixels are coated with color filter of peak transmission at 550 nm, they are referred as "Green pixels". One pixel is coated with color filter with peak at 450 nm (Blue pixel) and one with filter peaked at 630 nm (Red pixel). The two Green pixels are placed at the upper-right and lower-left quadrants. A Red pixel is placed at the upper-left quadrant and a Blue pixel is placed at lower-right quadrant. The color-filter-coated quadruplets are repeated for the entire 640×480 array.

FIG. 3A shows a top filter layer 106 in which the green and blue filters alternate across a row of pixels. Beneath the filter layer is a transparent surface electrode layer 108 comprised of about 0.06 micron thick layer of indium tin oxide which is electrically conductive and transmissive to visible light. Below the conductive surface electrode layer is a photoconductive layer comprised of three sub-layers. The uppermost sub-layer is an about 0.005 micron thick layer 110 of n-doped hydrogenated amorphous silicon. Under that layer is an about 0.5 micron layer 112 of un-doped hydrogenated-amorphous silicon. This 112 layer is referred to by Applicants as an "intrinsic" layer. This intrinsic layer is one which displays high electrical resistivity unless it is illuminated by photons. Under the un-doped layer is an about 0.01 micron layer 114 of high-resistivity P-doped hydrogenated-amorphous silicon. These three hydrogenated amorphous silicon layers produce a diode effect above each pixel circuit. Applicants refer to the layers as a P-I-N photoconductive layer. Carbon atoms or molecules may be added to layer 114 to increase electrical resistance. This would minimize the lateral crosstalk among pixels and avoids loss of spatial resolution. This P-I-N photoconductive layer is not lithographically patterned, but (in the horizontal plane) is a homogeneous film structure. This simplifies the manufacturing process. Within the sub-layer 114 are 307,200 4.6×4.6 micron electrodes 116 which define the 307,200 pixels in this preferred sensor array. Electrodes 116 are made of titanium nitride (TiN). Just below the electrodes 116 are CMOS pixel circuits 118. The components of pixel circuits 118 are described by reference to FIG. 3B. The CMOS pixel circuits 118 utilize three transistors 250, 248 and 260. The operation of a similar three transistor pixel circuit is described in detail in U.S. Pat. No. 5,886,353. This circuit is used in this embodiment to achieve maximum saving in chip area. Other more elaborate readout circuits are described in the parent patent applications referred to in the first sentence of this specification. Pixel electrode 116, shown in FIG. 3A, is connected to the charge-collecting node 120 also comprised of TiN. Pixel circuit 118 includes collection electrode 120, collection capacitor 246, source follower buffer 248, selection transistor 260, and reset transistor 250. Pixel circuit 118 uses p-channel transistors for reset transistor 250 and an n-channel transistor for source follower transistor 248 and selection transistor 260. The voltage at COL (out) 256 is proportional to the charge Q(in) stored on the collection capacitor 246. By reading this node twice, once after the exposure to light and once after the reset, the voltage difference is a direct proportional to the amount of light being detected by the Photo-sensing structure 122. Pixel circuit 118 is referenced to a positive voltage Vcc at node 262 (typically 2.5 to 5 Volts). Pixel circuitry for this array is described in detail in the '353 patent.

Other Camera Features

Figure 2:
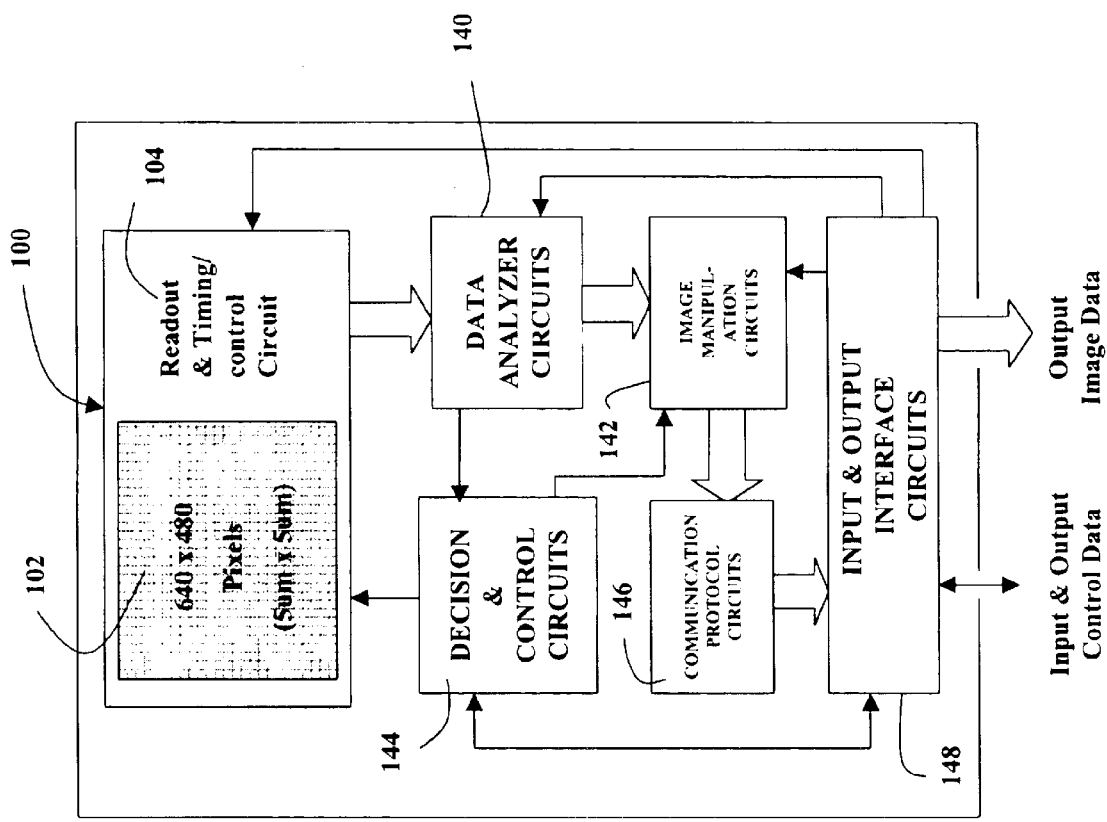
FIG. 2 shows some details of a CMOS integrated circuit utilizing some of the principals of the present invention.
Figure 3C:
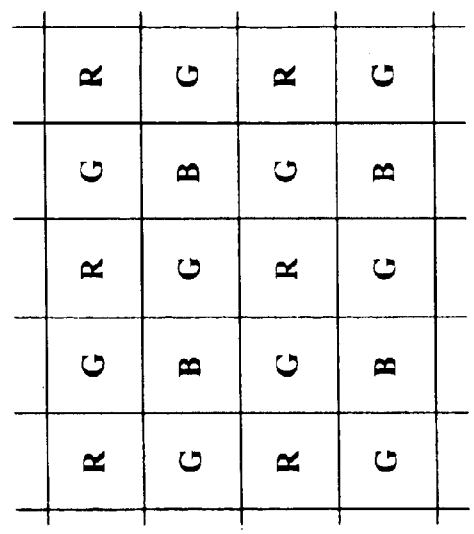
FIG. 3C shows a color filter grid pattern.
Figure 3B:
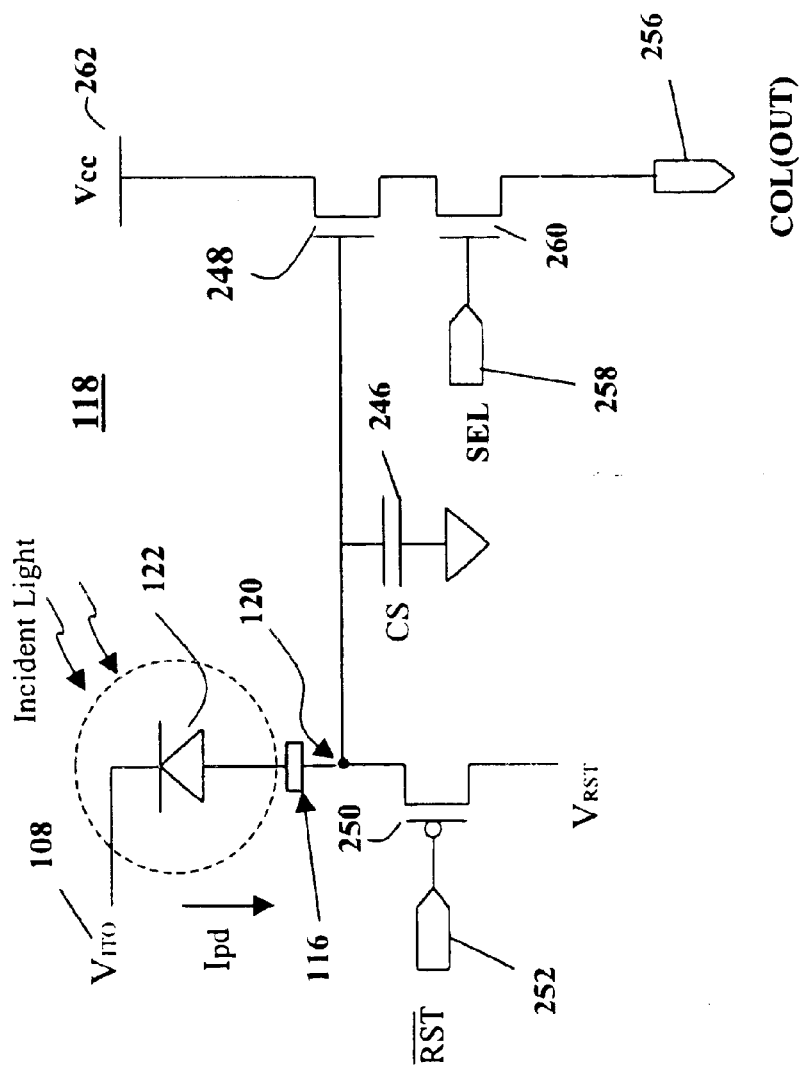
FIG. 3B shows CMOS pixel circuitry for a single pixel.

In this preferred embodiment, as shown in FIG. 2 additional MOS or CMOS circuits for converting the charges into electrical signal, for amplifying the signals, for converting analog signal into digital signal and for digital signal processing are provided on the same crystalline substrate utilized for the collection of the charges. The data out of the sensor section 100 is in digital form and with a pixel-sequential stream. The sensor chip area includes a standard clock generation feature (not shown here but described in the '353 patent). From it, signals representing the start of frame, start of line, end of a frame, end of line and pixel are distributed into all sections on the image chip to synchronize the data flow.

Environmental Analyzer Circuits

The data out of the sensor section is fed into an environmental analyzer circuit 140 where image's statistics is calculated. The sensor region is preferably partitioned into separate sub-regions, with the average or mean signal within the region being compared to the individual signals within that region in order to identify characteristics of the image data. For instance, the following characteristics of the lighting environment are measured:

1. light source brightness at the image plane
2. light source spectral composition for white balance purpose
3. imaging object reflectance
4. imaging object reflectance spectrum
5. imaging object reflectance uniformity The measured image characteristics are provided to decision and control circuits 144. The image data passing through an environmental analyzer circuit 140 are preferably not be modified by it at all. In this embodiment, the statistics include the mean of the first primary color signal among all pixels, the mean of the second primary color signal, the mean of the third primary color signal and the mean of the luminance signal. This circuit will not alter the data in any way but calculate the statistics and pass the original data to image manipulation circuits 142. Other statistical information, such as maximum and minimum will be calculated as well. They can be useful in terms of telling the range of the object reflectance and lighting condition. The statistics for color information is on full image basis, but the statistics of luminance signal is on a per sub-image regions basis. This implementation, permits the use of a weighted average to emphasize the importance of one selected sub-image, such as the center area.

Decision & Control Circuits

The image parameter signals received from the environmental analyzer 90 are used by the decision and control circuits 144 to auto-exposure and auto-white-balance controls and to evaluate the quality of the image being sensed, and based on this evaluation, the control module (1) provide feedback to the sensor to change certain modifiable aspects of the image data provided by the sensor, and (2) provide control signals and parameters to image manipulation circuits 142. The change can be sub-image based or full-image based. Feedback from the control circuits 144 to the sensor 100 provides active control of the sensor elements (substrate, image absorption layer, and readout circuitry) in order to optimize the characteristics of the image data. Specifically, the feedback control provides the ability to program the sensor to change operation (or control parameters) of the sensor elements. The control signals and parameters provided to the image manipulation circuits 142 may include certain corrective changes to be made to the image data before outputting the data from the camera.

Image Manipulation Circuits

Image manipulation circuits 142 receive the image data from the environmental analyzer and, with consideration to the control signals received from the control module, provides an output image data signal in which the image data is optimized to parameters based on the control algorithm. In these circuits, pixel-by-pixel image data are processed so each pixel is represented by three color-primaries. Color saturation, color hue, contrast, brightness can be adjusted to achieve desirable image quality. The image manipulation circuits provide color interpolation among each pixel and adjacent pixels with color filters of the same kind so each pixel can be represented by three color components. This provides enough information with respect to each pixel so that the sensor can human perception with color information for each pixel. It further does color adjustment so the difference between the color response of sensors and human vision can be optimized.

Communication Protocol Circuits

Communication protocol circuits 146 rearrange the image data received from image manipulation circuits to comply with communication protocols, either industrial standard or proprietary, needed for a down-stream device. The protocols can be in bit-serial or bit-parallel format. Preferably, communication protocol circuits 146 convert the process image data into luminance and chrominance components, such as described in ITU-RBT.601-4 standard. With this data protocol, the output from the image chip can be readily used with other components in the market place. Other protocols may be used for specific applications.

Input & Output Interface Circuits

Input and output interface circuits 148 receive data from the communication protocol circuits 146 and convert them into the electrical signals that can be detected and recognized by the down-stream device. In this preferred embodiment, the input & output Interface circuits 148 provide the circuitry to allow external to get the data from the image chip, read and write information from/to the image chip's programmable parametric section.

Chip Package

The image chip is packaged into an 8 mm×8 mm plastic chip carrier with glass cover. Depending upon the economics and applications, other type and size of chip carrier can be used. Glass-cover can be replaced by other type of transparent materials as well. The glass cover can be coated with anti-reflectance coating, and/or infrared cut-off filter. In an alternative embodiment, this glass cover is not needed if the module is hermetically sealed with a substrate on which the image chip is mounted, and assembled in a high quality clean room with lens mount as the cover.

The Camera

Lens 4 shown in FIG. 1C is based on a ¼.5" F/2.8 optical format and has a fixed focal length with a focus range of 3–5 meters. Because of the smaller chip size, the entire camera module can be less than 10 mm (Length)×10 mm (Width)× 10 mm (Height). This is substantially smaller than the human eyeball! This compact module size is very suitable for portable appliances, such as cellular phone and PDA. Lens mount 12 is made of black plastic to prevent light leak and internal reflectance. The image chip is inserted into the lens mount with unidirectional notches at four sides, so to be provide a single unit once the image chip is inserted in and securely fastened. This module has metal leads on the 8 mm×8 mm chip carrier that can be soldered onto a typical electronics circuit board.

Examples of Feedback & Control

Camera Exposure Control

Sensor 100 can be used as a photo-detector to determine the lighting condition. Since the sensor signal is directly proportional to the light sensed in each pixel, one can calibrate the camera to have a 'nominal' signal under desirable light. When the signal is lower than the "nominal" value, it means that the ambient "lighting level" is lower than desirable. To bring the electrical signal back to "nominal" level, the pixel exposure time to light and/or the signal amplification factor in sensor or in the image manipulation module are automatically adjusted. The camera may be programmed to partition the full image into sub-regions is to be sure the change of operation can be made on a sub-region basis or to have the effect weighted more on a region of interest.

Camera White Balance Control

The camera may be used under all kind of "light sources". Each light source has different spectral distribution. As a result, the signal out of the sensor will vary under different "light source". However, one would like to make the image visualized similarly when displayed on a visualizing device, such as print paper or CRT display. It means that a typical light source (day light, flash light, tungsten light bulb, etc) needs to be perceived as a white object more or less. Since the sensor has pixels covered with primary color filters, one can then determine the relative intensity of the light source from the image data. The environmental analyzer is to get the statistics of the image and determine the spectral composition and make necessary parametric adjustment in sensor operation or Image Manipulation to create a signal that can be displayed as "white object" when perceived by human.

Variations

One preferred embodiment of the present invention has been described in detail above. However, many variations from that description may be made within the scope of the present invention. For example, the three-transistor pixel design described above could be replaced with more elaborate pixel circuits (including 4,5 and 6 transistor designs) described in detail the parent applications. The additional transistors provide certain advantages as described in the referenced applications at the expense of some additional complication. The photoconductive layers described in detail above could be replaced with other electron-hole producing layers as described in the parent application or in the referenced '353 patent. The photodiode layer could be reversed so that the p-doped layer is on top and the n-doped layer is on the bottom in which case the charges would flow through the layers in the opposite direction. The transparent layer could be replaced with a grid of extremely thin conductors. The readout circuitry and the camera circuits 140–148 as shown in FIG. 2 could be located partially or entirely underneath the CMOS pixel array to produce an extremely tiny camera. The CMOS circuits could be replaced partially or entirely by MOS circuits. Some of the circuits 140–148 shown on FIG. 2 could be located on one or more chips other than the chip with the sensor array. For example, there may be cost advantages to separate the circuits 144 and 146 onto a separate chip or into a separate processor altogether. The number of pixels could be increased or decreased from 0.3 mega-pixels almost without limit.

Other Camera Applications

This invention provides a camera potentially very small in size, potentially very low in fabrication cost and potentially very high in quality. Naturally there will be some tradeoffs made among size, quality and cost, but with the high volume production costs in the range of a few dollars, a size measured in millimeters and image quality measured in mega-pixels or fractions of mega-pixels, the possible applications of the present invention are enormous. Some potential applications in addition to cell phone cameras are listed below:

Analog camcorders

Digital camcorders

Security cameras

Digital still cameras

Personal computer cameras

Toys

Endoscopes

Military unmanned aircraft, bombs and missiles

Sports

High definition Television sensor

Eyeball Camera

Since the camera can be made smaller than a human eyeball, one embodiment of the present invention is a camera fabricated in the shape of a human eyeball. Since the cost will be low the eyeball camera can be incorporated into many toys and novelty items. A cable may be attached as an optic nerve to take image data to a monitor such as a personal computer monitor. The eyeball camera can be incorporated into dolls or manikins and even equipped with rotational devices and a feedback circuit so that the eyeball could follow a moving feature in its field of view. Instead of the cable the image data could be transmitted wirelessly using cell phone technology.

A Close—Up View of a Football Game

The small size of these cameras permits them along with a cell phone type transmitter to be worn (for example) by professional football players installed in their helmets. This way TV fans could see the action of professional football the way the players see it. In fact, the camera plus a transmitter could even be installed in the points of the football itself which could provide some very interesting action views. These are merely examples of thousands of potential applications for these tiny, inexpensive, high quality cameras.

While there have been shown what are presently considered to be preferred embodiments of the present invention, it will be apparent to those skilled in the art that various changes and modifications can be made herein without departing from the scope and spirit of the invention. For example, this camera can be used without the lens to monitor the light intensity profile and output the change of intensity and profile. This is crucial in optical communication application where beam profile needs to be monitored for highest transmission efficiency. This camera can be used to extend light sensing beyond visible spectrum when the amorphous-Silicon is replaced with other light sensing materials. For example, one can use microcrystalline-Silicon to extend the light sensing toward near-infrared range. Such camera is well suitable for night vision. In the preferred embodiment, we use a package where senor is mounted onto a chip carrier on which is clicked onto a lens housing. One can also change the assembly sequence by solder the sensor onto a sensor board first, then put the lens holder with lens to cover the sensor and then mechanically fasten onto the PCB board to make a camera. This is a natural variation from this invention to those skilled in the art.

Thus, the scope of the invention is to be determined by the appended claims and their legal equivalents.

What is claimed is:

1. A MOS or CMOS based active sensor array comprising:
   A) an active sensor array fabricated on or in a crystalline substrate, said sensor array comprising:
      1) a layer of charge generating material for converting the electron-hole producing light into electrical charges,
      2) a plurality of MOS or CMOS pixel circuits, each pixel circuit comprising a charge collecting electrode, located under the charge generating layer for collecting the charges, and
      3) a surface electrode in the form of a thin transparent layer or grid located above said layer of charge generating material, and
   B) additional MOS or CMOS circuits in and/or on the same crystalline substrate with said active sensor array for converting the charges into images.

2. An array as in claim 1 wherein said plurality of MOS or CMOS pixel circuits is a plurality of CMOS pixel circuits.

3. An array as in claim 1 wherein said plurality of pixels is at least 0.3 million pixels.

4. An array as in claim 1 and also comprising data analyzing circuits fabricated on said crystalline substrate.

5. An array as in claim 4 and also comprising image manipulation circuits fabricated on said crystalline substrate.

6. An array as in claim 5 and also comprising input and output interface circuits fabricated on said crystalline substrate.

7. An array as in claim 6 and also comprising decision and control circuits fabricated on said crystalline substrate.

8. An array as in claim 7 and also comprising communication circuits fabricated on said crystalline substrate.

9. An array as in claim 1 wherein said array is an integral part of a camera attached by a cable to a cellular phone.

10. An array as in claim 1 wherein said surface electrode is comprised of a layer of indium tin oxide.

11. An array as in claim 1 wherein said array in an integral part of a camera in a cellular phone.

12. An array as in claim 1 and further comprising an array of color filters located on top of said surface electrode.

13. An array as in claim 12 wherein said color filters are comprised of red, green and blue filters arranged in four color quadrants of two green, one red and one blue.

14. An array as in claim 1 wherein said array is a part of a camera fabricated in to form of a human eyeball.

15. An array as in claim 7 wherein said decision and control circuits comprise a processor programmed with a control algorithm for analyzing pixel data and based on that data controlling signal output from said sensor array.

16. An array as in claim 15 wherein said processor controls signal output by adjusting pixel illumination time.

17. An array as in claim 15 wherein said processor controls signal output by adjusting signal amplification.

18. An array as in claim 1 wherein said array is a part of a camera incorporated into a device chosen from the following group:

Analog camcorder
Digital camcorder
Security camera
Digital still camera
Personal computer camera
Toy
Endoscope
Military unmanned aircraft, bomb and missile
Sports equipment
High definition Television sensor.

19. A camera with a MOS or CMOS based active sensor array for producing electronic images from electron-hole producing light, said camera comprising:
   A) an active sensor array fabricated on or in a crystalline substrate, said sensor array comprising:
      1) a layer of charge generating material for converting the electron-hole producing light into electrical charges,
      2) a plurality of MOS or CMOS pixel circuits, each pixel circuit comprising a charge collecting electrode, located under the charge generating layer for collecting the charges, and
      3) a surface electrode in the form of a thin transparent layer or grid located above said layer of charge generating material,
   B) additional MOS or CMOS circuits in and/or on the same crystalline substrate with said active sensor array for converting the charges into images, and
   C) focusing optics for focusing electron-hole producing light onto said active sensor array.

20. A camera as in claim 19 wherein said plurality of MOS or CMOS pixel circuits is a plurality of CMOS pixel circuits.

21. A camera as in claim 19 wherein said plurality of pixels is at least 0.3 million pixels.

22. A camera as in claim 19 and also comprising data analyzing circuits fabricated on said crystalline substrate.

23. A camera as in claim 22 and also comprising image manipulation circuits fabricated on said crystalline substrate.

24. A camera as in claim 23 and also comprising input and output interface circuits fabricated on said crystalline substrate.

25. A camera as in claim 24 and also comprising decision and control circuits fabricated on said crystalline substrate.

26. A camera as in claim 25 and also comprising communication circuits fabricated on said crystalline substrate.

27. A camera as in claim 19 wherein said camera is attached by a cable to a cellular phone.

28. A camera as in claim 19 wherein said surface electrode is comprised of a layer of indium tin oxide.

29. A camera as in claim 19 wherein said camera in an integral part of a cellular phone.

30. A camera as in claim 19 and further comprising an array of color filters located on top of said surface electrode.

31. A camera as in claim 30 wherein said color filters are comprised of red, green and blue filters arranged in four color quadrants of two green, one red and one blue.

32. A camera as in claim 19 wherein said camera is fabricated in to form of a human eyeball.

33. A camera as in claim 25 wherein said decision and control circuits comprise a processor programmed with a control algorithm for analyzing pixel data and based on that data controlling signal output from said sensor array.

34. A camera as in claim 33 wherein said processor controls signal output by adjusting pixel illumination time.

35. A camera as in claim 33 wherein said processor controls signal output by adjusting signal amplification.

36. A camera as in claim 19 wherein said camera is incorporated into a device chosen from the following group:

Analog camcorder
Digital camcorder
Security camera
Digital still camera
Personal computer camera
Toy
Endoscope
Military unmanned aircraft, bomb and missile
Sports equipment
High definition Television sensor.

* * * * *

UNITED STATES PATENT AND TRADEMARK OFFICE
CERTIFICATE OF CORRECTION

PATENT NO. : 6,730,900 B2 Page 1 of 1
APPLICATION NO. : 10/371618
DATED : May 4, 2004
INVENTOR(S) : Tzu-Chiang Hsieh et al.

It is certified that error appears in the above-identified patent and that said Letters Patent is hereby corrected as shown below:

On title page, first column, item 75 in the list of Inventors, line 1, change: "Tzu-Chiang Hsish" to -- Tzu-Chiang Hsieh --

Signed and Sealed this

Twenty-fourth Day of November, 2009

David J. Kappos
*Director of the United States Patent and Trademark Office*